US007335603B2

(12) United States Patent
Mancevski

(10) Patent No.: US 7,335,603 B2
(45) Date of Patent: Feb. 26, 2008

(54) SYSTEM AND METHOD FOR FABRICATING LOGIC DEVICES COMPRISING CARBON NANOTUBE TRANSISTORS

(76) Inventor: Vladimir Mancevski, 4806 Alta Lorna Dr., Dallas, TX (US) 78749

( * ) Notice: Subject to any disclaimer, the term of this patent is extended or adjusted under 35 U.S.C. 154(b) by 919 days.

(21) Appl. No.: 09/779,374

(22) Filed: Feb. 7, 2001

(65) Prior Publication Data

US 2001/0023986 A1 Sep. 27, 2001

Related U.S. Application Data

(60) Provisional application No. 60/180,595, filed on Feb. 7, 2000.

(51) Int. Cl.
H01L 21/31 (2006.01)
(52) U.S. Cl. .................. 438/758; 977/742; 257/E51.04
(58) Field of Classification Search ................ 438/758; 977/742; 257/E51.04
See application file for complete search history.

(56) References Cited

U.S. PATENT DOCUMENTS

| | | | | |
|---|---|---|---|---|
| 5,973,444 | A * | 10/1999 | Xu et al. ..................... | 313/309 |
| 6,038,060 | A * | 3/2000 | Crowley ..................... | 359/328 |
| 6,337,289 | B1 * | 1/2002 | Narwankar et al. ......... | 438/776 |
| 6,504,292 | B1 * | 1/2003 | Choi et al. .................. | 313/310 |
| 6,650,061 | B1 * | 11/2003 | Urayama et al. ......... | 315/169.3 |

OTHER PUBLICATIONS

Li, J., et al "Highly-Ordered Carbon Nanotube Arrays for Electronics Applications" Applied Physics Letters vol. 75, No. 3 (Jul. 19, 1999), pp. 367-369. XP-00085012.

Chico, L., et al "Pure Carbon Nanoscale Devices: Nanotube Heterojunctions" Physical Review Letters, vol. 76, No. 6 (Feb. 5, 1996), pp. 971-974.

Collins, P.G., et al "Nanoscale Electronic Devices on Carbon Nanotubes" Fifth Foresight Conference on Molecular Technology [online] [retrieved on Apr. 23, 2002]. Retrieved from the Internet: <URL:http://www.foresight.org/Conferences/MNT05/Papers/Collins/index/html>.

Terrones, M., et al "Controlled Production of Aligned-Nanotube Bundles" Nature, vol. 388, (Jul. 3, 1997), pp. 52-55.

Hornyak, G.L., et al "Template Synthesis of Carbon Nanotubes" Fourth International Conference on Nanostructured Materials. NanoStructured Materials, vol. 12, (1999), pp. 83-88. PIIS-0965-9773 (99) 00071-9.

Martel, R., et al "Single and Multi-Wall Carbon Nanotube Field-Effect Transistors" Applied Physics Letters, vol. 73, No. 17 (Oct. 26, 1998), pp. 2447-2449. XP-000996900.

Vedeneev, A.S., et al "Molecular-Scale Rectifying Diodes Based on Y-Junction Carbon Nanotubes" International Electronic Devices Meeting, (1999), XP-001004406.

(Continued)

*Primary Examiner*—Bradley K Smith

(57) ABSTRACT

Carbon nanotube devices and methods for fabricating these devices, wherein in one embodiment, the fabrication process consists of the following process steps: (1) generation of a template, (2) catalyst deposition, and (3) nanotube synthesis within the template. In another embodiment, a carbon nanotube transistor comprises a carbon nanotube having two or more defects, wherein the defects divide the carbon nanotube into three regions having differing conductivities. The defects may be introduced by varying the diameter of a template in which the carbon nanotube is fabricated and thereby causing pentagon-heptagon pairs which form the defects.

11 Claims, 5 Drawing Sheets

OTHER PUBLICATIONS

Li, J., et al "Growing Y-Junction Carbon Nanotubes" Nature, vol. 402, (Nov. 18, 1999), pp. 253-254.

Menon, M., et al "Fullerene-Derived Molecular Electronic Devices" Semiconductor Science and Technology, vol. 13, (1998), pp. A51-A54. XP 000768865.

Saito, S., "Carbon Nanotubes for Next-Generation Electronics Devices" Science, vol. 278, (Oct. 3, 1997), pp. 77-78.

Suenaga, K., et al "Synthesis of Nanoparticles and Nanotubes with Well-Separated Layers of Boron Nitride and Carbon" Science, vol. 278, (Oct. 24, 1997), pp. 653-655.

Van Haesendonck, C., et al "Nanowire Bonding with the Scanning Tunneling Microscope" Surface Science, 386, (1997), pp. 279-289. PII 50039-6028 (97) 00307-5.

Tans, S.J., et al "Room-Temperature Transistor Based on A Single Carbon Nanotube" Nature, vol. 393, (May 7, 1998), pp. 49-52.

Hu, J., et al "Controlled Growth and Electrical Properties of Heterojunctions of Carbon Nanotubes and Silicon Nanowires" Nature, vol. 399, (May 6, 1999), pp. 48-51.

Bard, A.J., et al "Bulk Electrolysis Methods" Electromechemical Methods: Fundamentals and Applications (New York, John Wiley & Sons, Inc., 1980), pp. 370-428.

Ohji, H., et al "Macro Porous Silicon Formation for Micromachining" Micromachining and Microfabrication Process Technology III, (Sep. 29-30, 1997), Proceedings of SPIE, vol. 3223, pp. 189-197.

Bomchil, G., et al "Porous Silicon: Material Properties, Visible Photo and Electroluminescence" Proceedings of the Sixth International Conference on Solid Films and Surfaces, Jun. 29-Jul. 3, 1992, pp. 394-407.

Lehmann, V., et al "Formation Mechanism and Properties of Electrochemically Etched Trenches in n-Type Silicon" J. Electrochem, Soc., vol. 137, No. 2, (Feb. 1990), pp. 653-659.

Che, G., et al "Chemical Vapor Deposition Based Synthesis of Carbon Nanotubes and Nanofibers Using a Template Method" [online] Chem. Mater., vol. 10, 1998, pp. 260-267. Retrieved from the Internet: <URL:http://bucky-central.mech,edu/Rnoffs/76.pdf>.

* cited by examiner

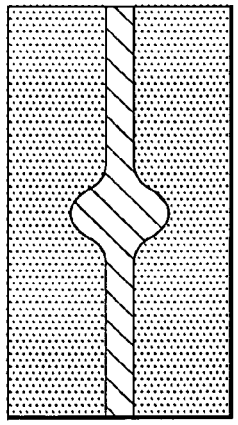 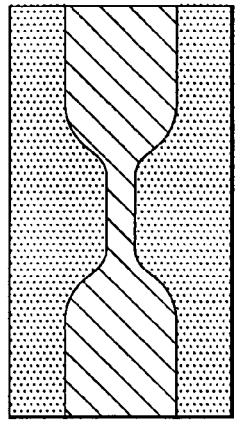 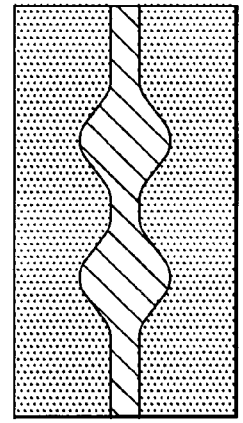 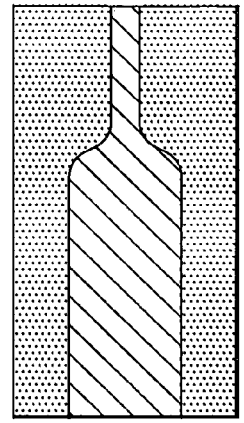
FIG. 6A   FIG. 6B   FIG. 6C   FIG. 6D
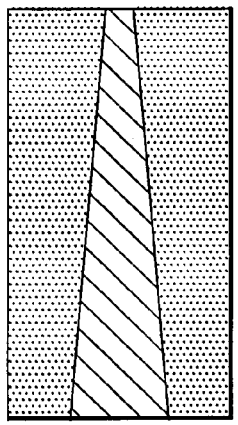 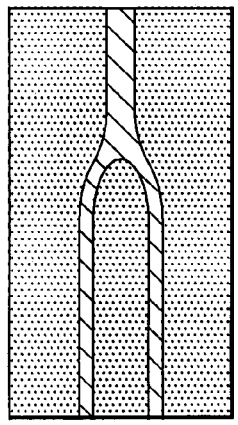 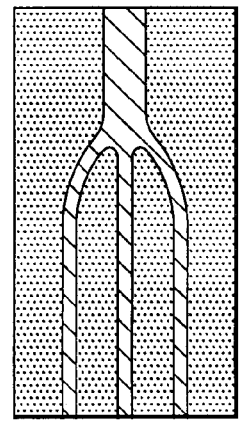 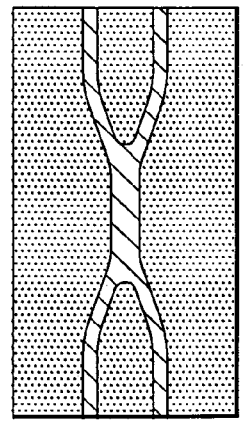
FIG. 6E   FIG. 7A   FIG. 7B   FIG. 7C
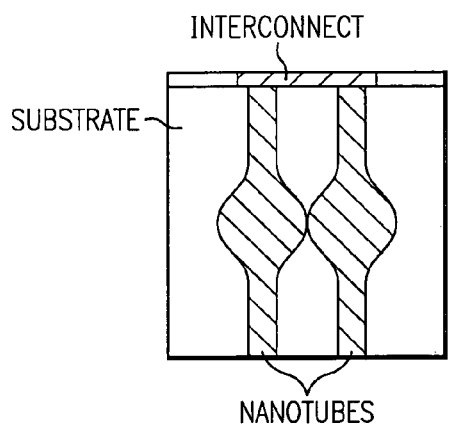
FIG. 8

SYSTEM AND METHOD FOR FABRICATING LOGIC DEVICES COMPRISING CARBON NANOTUBE TRANSISTORS

RELATED APPLICATIONS

This application claims the benefit of U.S. Provisional Application No. 60/180,595 filed on Feb. 7, 2000 and patent application Ser. No. 09/779,374 having a filing date of Feb. 7, 2001.

TECHNICAL FIELD OF THE INVENTION

This invention relates generally to logic devices and more specifically to a design, system, and method for fabricating logic devices comprising carbon nanotube molecular electronic devices.

BACKGROUND OF THE INVENTION

The U.S. semiconductor industry is facing increasingly difficult challenges as it moves into the production of features at sizes approaching 100 nanometers. The magnitude of some of these challenges has led to their being singled out as industry leaders as "grand challenges" requiring major initiatives to develop solutions using approaches with no historical precedent. Four of the six grand challenges identified in the National Technology Roadmap For Semiconductor include the ability to have affordable scaling, affordable lithography at and below 100 nanometers, new materials and structures, and gigahertz frequency operations on chips.

According to the technology roadmap for semiconductors, the minimum size of features will have to reach 130 nanometers by 2003 to keep pace with the continued doubling of the number of transistors on a chip every 18 months. After 2003, the roadmap indicates a lack of consensus about how to solve the fabrication challenges that lie beyond the 100 nanometer barrier. The problem confronting the industry is that the dominant technology used to make chips, optical lithography, used light to form patterns on silicon. Below 100 nanometers, the wavelength of light typically employed in chip production (193 nanometers and 157 nanometers) are too large to be useful. Several candidate technologies are currently vying for selection as successors to optical lithography. These include extreme ultraviolet lithography (EUV), an electron beam method called scalpel, and x-ray lithography. None has yet emerged as the preferred choice. Since it takes several years to bring the new technology up and running, the large semiconductor manufacturers are becoming increasingly concerned about the time and capital investments that will be required to keep pace with the marketplace demands.

Therefore, it would be desirable to demonstrate the feasibility of fabricating carbon nanotube molecular electronic devices with a nanosize diameter (1-50 nanometers), micro-to-submicron size length (100-1000 nanometers), and gate few nanometers long (1-5 nanometers).

It is widely recognized that the development of molecular electronics based on carbon nanotubes would enable logic devices to be built with billions of transistors and computers that are orders of magnitude more powerful than today's machines. Smart structures in salt grain size computers, for example, could be designed with integrated logic provided by 3-D array of molecular electronic devices. Further advances in wearable computers and other, as yet unforeseen, product possibilities will become more likely. Molecular electronics could also make possible information storage devices with immense capacity. For example, hard disks with storage capacities of terrabytes ($10^{12}$ bytes) in small products the size of wristwatches with large storage capacities. Before these dreams become a reality, a way must be found to mass produce the molecular electronics devices. Scanning probe methods have proven feasible to fabricate single devices one atom at a time, but no way has yet been found to scale up the process. Chemically based self-assembly processes have also been suggested, but so far only the simplest structures have been built using this method. The problem of combining different materials and assembling molecular electronic devices with specific features remains a daunting challenge.

Theoretical work by Chico et. al. (L. Chico, V. H. Crespi, L. X. Benedict, S. G. Louie, and M. L. Cohen, "Pure Carbon Nanoscale Devices: Nanotube Heterojunctions," Physical Review Letters, Vol. 76, No. 6, 5 February 1996) has suggested that introducing pentagon-heptagon pair defects into otherwise hexagonal nanotube structure may create junction between two topologically or electrically different nanotubes as bases for nanoscale nanotube devices. Saito (S. Saito, "Carbon Nanotubes for Next Generation Electronic Devices," Science, Vol. 278, 3 Oct. 1997) describes possible theoretical designs of a carbon nanotube that may function as molecular electronic devices. Those and other similar theoretical works outline the possibility to use carbon nanotubes as molecular devices but is fail to propose a design of such device and a method of its fabrication.

Collins et. al. (P. Collins, H. Bando, A. Zettl, "Nanoscale Electronic Devices on Carbon Nanotubes," Fifth Foresight Conference on Molecular Nanotechnology) have experimentally demonstrated the rectification properties of single-wall carbon nanotubes. This work also fails to propose a design of carbon nanotube molecular electronic device and a method of its fabrication.

Suenaga et. al. (K. Suenaga, C. Colliex, N. Demoncy, A. Loiseau, H. Pascard, F. Willaime, "Synthesis of Nanopaticles and nanotubes with Well-Separated Layers of Boron Nitride and Carbon," Science, Vol. 278, 1997) have reported an effort to fabricate nanoscale electronic devices by fabricating concentric nanotubes out of carbon and boron nitride. This concentric design is achieved by filling-in already synthesized carbon nanotube. This design concept may work for a two-terminal device such as diode but cannot be scaled to function as a three-terminal device such as transistor. This work has also failed to explain how such device would function and has not addressed the interconnect problem.

M. Terrones et. al. (M. Terrones et. al., "Controlled production of aligned-nanotube bundles," Letters to Nature, Vol 388, July 1997) reported on efforts to fabricate horizontally aligned carbon nanotubes that may be used as electronic devices. This effort fails to describe any design of a carbon nanotube molecular device.

Most recent designs of carbon nanotube based molecular electronic devices, such as Dekker et. al. (Tans S J, Verschueren A R M, Dekker C, "Room-temperature transistor based on a single carbon nanotube," Nature 393: (6680) 49-52, May 7, 1998), consist of a carbon nanotube spanned over two, three, or more metal electrodes. Such device may indeed function as a diode or a transistor but it cannot be scaled and cannot be connected to yet another carbon nanotube transistor.

Most recently Hu et. al. (J. Hu, M. Ouyang, P. Yang, and C. Lieber, "Controlled growth and electrical properties of heterojunctions of carbon nanotubes and silicon nanowires," Nature, Vol. 399, May 1999) has demonstrated nanoscale electronic device made of joined Si nanowire and carbon nanotube. Although successful, this nano-devices cannot be scaled up and therefore cannot be practically fabricated in a large-scale manufacturing operation.

None of the state-of-the-art research has addressed the scalability of fabricating carbon nanotube based molecular electronic devices, their interconnection, and interconnection between the molecular logic device and the outside world.

Most recently Li et. al. (J. Li, C. Papadopoulos, University of Toronto; J. Xu, Brown University, "Growing Y-junction carbon nanotubes," Nature, Vol 402, 18 Nov. 1999, pp. 253) has used nanostructured template channels to grow Y-junction carbon nanotube heterostructures from nanochannel alumina template. They first created the top pores with one voltage and then reduced it midway through the electrochemical formation of the pores. They observed that the voltage is proportional to number of pores, therefore, twice as many appeared, most branching from the original pore. This creates Y template. Catalyst was deposited electrochemically at the bottom of the template channels from which carbon nanotubes were grown. Top CNTs were close to twice the diameter of the two bottom branches. They observed that the length of the pores depends on the thickness of the substrate and the length of the Y junction depends on the timing of the current alteration. The method described in this work only addresses formation of large number of evenly distributed templates without control over pattern of the template. Use of template with variable shape to create carbon nanotube that conforms that shape and the method of producing the variable template has been disclosed in U.S. Pat. No. 6,146,227, on page 5, line 43, entitled "Method for Manufacturing Carbon Nanotubes as Functional Elements of MEMS Devices" which is incorporated herein by reference.

The present invention solves all of the above problems that were not addressed by current research. The present invention identifies several designs of carbon nanotube electronic devices made of individual vertically aligned carbon nanotubes embedded in a silicon or aluminum substrate. The advantage of this design is that it is flexible and is suitable for fabrication of two-terminal (diodes) and three-terminal (transistors) carbon nanotube electronic devices, and more complex logic devices made of plurality of carbon nanotube diodes and transistors. Another advantage of the design is that offers true 3-D architecture. Another advantage of the design is that it includes interconnects between the carbon nanotube devices and interconnects with the outside world.

The advantage of the fabrication process is that it can produce patterns of vertically grown carbon nanotubes with control over the location, dimension, and electric properties of the carbon nanotube. Another advantage of the fabrication process is that it can be scaled to produce large number of devices with a batch process. Another advantage of the fabrication process is that it can also fabricate the interconnects. Another advantage of the fabrication process is that vertical growth permits high-density packing of devices. The fabrication technology will enable device densities of $10^{12}$ per cm$^2$ (for 3 vertically stacked devices) limited only by lateral interconnect technology (among the carbon nanotubes) and the number of vertically stacked devices. With the help of lateral carbon nanotube interconnects, the technology could provide device densities to $10^{14}$ per cm$^2$. Further vertical stacking of the devices would enable magnitudes more of device densities.

The carbon nanotube devices of this invention and their fabrication process are suitable for large-scale manufacturing and interconnection of molecular electronic devices in a "salt-grain" size integrated circuit. This large-scale, low-cost approach will provide extremely fast, low-power, ultra-high-density logic and memory devices which operate at room temperature. The resulting product possibilities include fast, multi-gigaflop processors, smart structures, wearable computers, random access memories with terabyte ($10^{14}$ bytes) capacities, and other exciting new market opportunities.

SUMMARY OF THE INVENTION

One or more of the problems outlined above may be solved by the invention of the present disclosure. The disclosure describes designs of carbon nanotube molecular devices and integrated processes for manufacturing and interconnecting a 3-D architecture of molecular devices made of carbon nanotubes, suitable for large-scale manufacturing. This large-scale, low-cost approach may provide extremely fast, low-power, ultra-high-density logic and memory devices which operate at room temperature.

In one embodiment, a logic device comprises a plurality of interconnecting carbon nanotube devices, wherein the interconnecting carbon nanotube devices comprise a plurality of electrically connected carbon nanotubes on one or differing vertical levels, and wherein the carbon nanotubes are formed within at least one nanosized catalyst retaining structure.

In another embodiment, a method of fabricating a carbon nanotube device comprises the steps of fabricating a template of nanosized catalyst retaining structures within a substrate, depositing catalyst within the nanosized catalyst retaining structures, and synthesizing carbon nanotubes that conform to the template of the nanosized catalyst retaining structures.

In another embodiment, a method for manufacturing an array of transistors comprises growing aligned carbon nanotubes within a catalyst retaining template, and introducing at least one discontinuity within a structure of the carbon nanotubes, wherein the discontinuity is a conductivity discontinuity along a vertical axis of the carbon nanotubes, wherein if one discontinuity is introduced a diode is formed and if two discontinuities is introduced a transistor is formed.

In another embodiment, a carbon nanotube transistor comprises a carbon nanotube with at least two defects therein, and wherein the defects divide the carbon nanotube into three regions with differing conductivities.

In another embodiment, a logic device comprises a substrate, a layer of insulating material in which at least one catalyst retaining structure is formed, at least one carbon nanotube formed within the catalyst retaining structure, wherein the carbon nanotube has at least two defects therein, and wherein the defects divide the carbon nanotube into at least three regions with differing conductivities.

It should be noted that many other embodiments may be apparent from this disclosure, and that such embodiments are intended to be included within the scope of the claims appended below.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 6 shows an example of template discontinuities possible with electrochemical etching controlled by varying the current flux as function of time;

FIG. 7 shows an example of template discontinuities possible with electrochemical etching controlled by spacing of the templates, doping concentration, and varying the current flux as function of time;

FIG. 8 shows method for establishing direct lateral connection between adjacent carbon nanotubes by sufficiently expanding nanotubes' diameters;

DETAILED DESCRIPTION OF THE INVENTION

Preferred embodiments of the present invention are illustrated in the FIGURES, like numerals being used to refer to like and corresponding parts of the various drawings.

Figure 1:
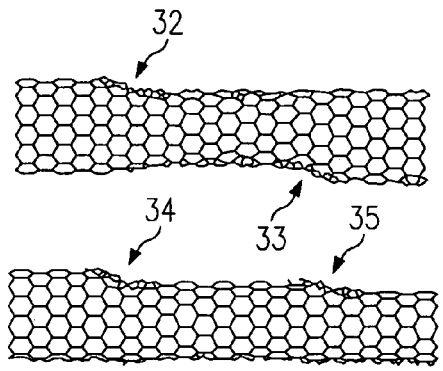
FIG. 1 shows two of many possible configurations for carbon nanotube molecular electronic devices. The structural defects (pentagon-heptagon pairs) produce a discontinuity in conductivity, believed to be the origin of the experimentally observed rectifying behavior.

FIG. 1 illustrates two possible configurations of carbon nanotube molecular electronic devices. The structural defects 32-35, as illustrated in FIG. 1, are pentagon-heptagon pairs which produce a discontinuity in conductivity. By fabricating vertically aligned carbon nanotube transistors with the fabrication technology disclosed in this application and related U.S. patent application Ser. No. 09/669,212 entitled "Flat Panel Display Comprising An Array Of Nanotubes" filed on Sep. 25, 2000, which is incorporated herein by reference, enables device densities of $10^{12}$ per $cm^2$ limited only by lateral interconnect technology among the carbon nanotubes. Another interconnect technology may make it possible to provide device densities of $10^{14}$ devices per $cm^2$. The production of multiple carbon nanotube transistors along the vertical axis of a single carbon nanotube is also an entirely new idea.

Figure 2:
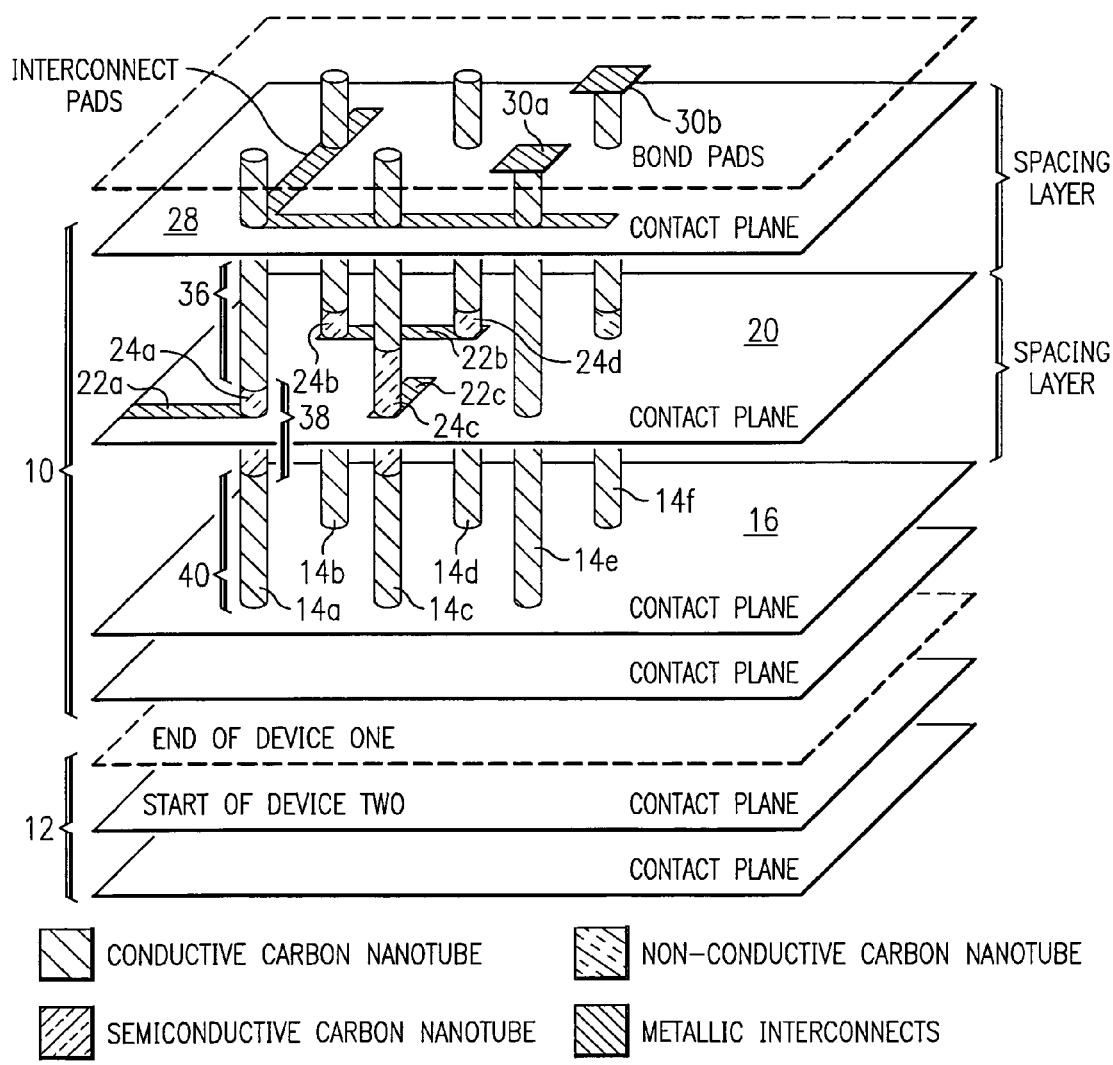
FIG. 2 shows schematic representation of a portion of a carbon nanotube molecular electronic device architecture, including vertical metallic nanotube interconnects and horizontal metallic film interconnects.

FIG. 2 illustrates complex devices in a 3-D architecture of carbon nanotube molecular electronic devices. It is possible with the innovative fabrication method to manufacture an array of electronic devices made of carbon nanotubes. The illustration shown in FIG. 2 provides a stack of vertically stacked electronic devices with a first electronic device 10 and a second electronic device 12 stacked under first electronic device 10. Electronic device 10 comprises a plurality of vertically aligned carbon nanotubes 14 that are grown from a first contact plane 16. The vertically aligned carbon nanotubes 14 are grown within vertically aligned holes within a substrate material. A contact plane 20 is provided allowing conducting interconnects 22 to contact the gates 24 of vertical carbon nanotube transistors 14. A second layer of substrate material surrounds the upper portion of the carbon nanotube transistors 14, ending in an upper contact plane 28 with bond pads 30 allowing the transistors or other logic devices within the device to be accessed from the outside world. A single carbon nanotube segment 14 will have two defects which divide the carbon nanotube 14 into three different conducting regions 36, 38 and 40 along the length of the nanotube. Altering the conductivity at many points along the nanotube axis also allows one to build multiple stacked transistors on a single carbon nanotube of the array, thus offering a 3-D architecture as illustrated by the transistor device 12 stacked beneath electronic device 10. The interconnection of carbon nanotube transistors in a given layer, or as stacked on carbon nanotube, can constitute a logic device.

Figure 3:
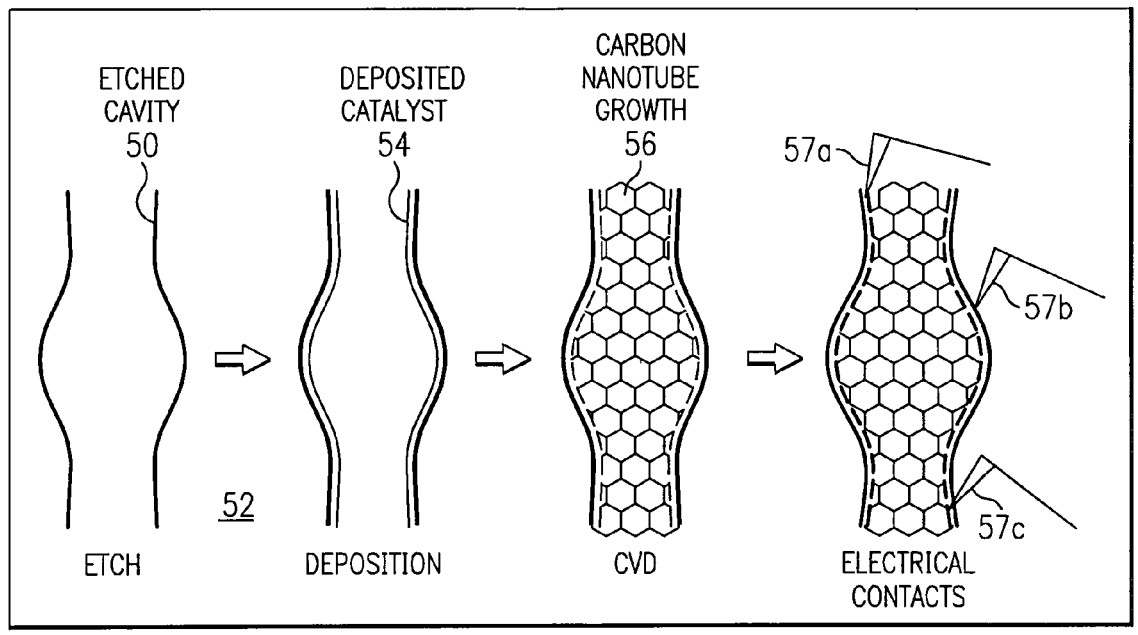
FIG. 3 shows carbon nanotube molecular electronic device fabrication process steps.

The proposed carbon nanotube device fabrication process consists generally of the following process steps, which are illustrated in FIG. 3: the generation of a template, such as the etched cavity 50, within a substrate material 52 or other like structure; the deposition of a catalyst 54 along the inner walls of the etched cavity 50, which is then followed by the carbon nanotube growth or synthesis of carbon nanotube 56, which is molded to conform to the etched cavity 50. Electrical contacts (interconnects) 57 may be fabricated at various places along the vertical axis of the carbon nanotube 56. It is possible to generate an array of template holes or etched cavities 50 by using an electrochemical etching on a selected substrate such as silicon or aluminum.

Figure 4:
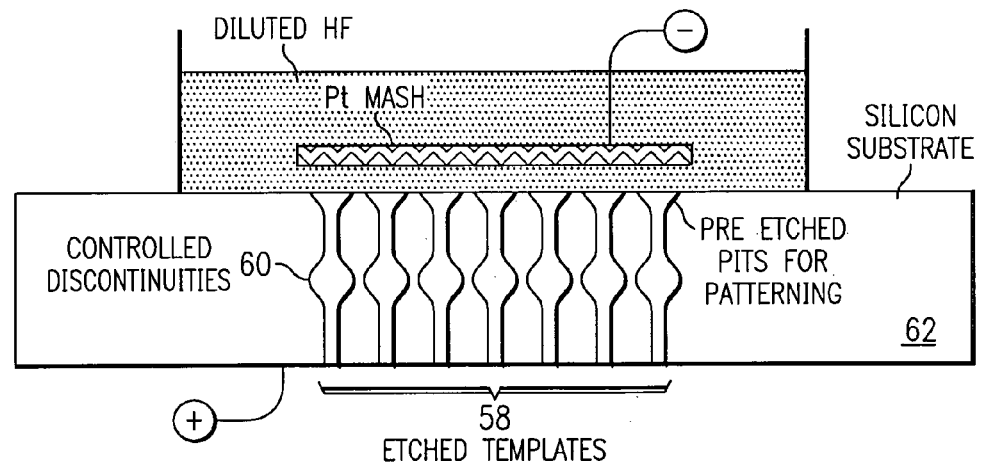
FIG. 4 shows the set-up for controllable electrochemical etching of the template location, diameter, shape and length.

An example of the electrochemical setup is shown in FIG. 4, wherein an array of etched templates 58 with controlled discontinuity 60 is formed within a substrate 62. It is possible, in some embodiments of the present invention, that pits 63 are pre-etched for patterning the etched templates. Depending on the desired outcome and the variation in the process parameters (primarily the etching current), the diameter of the generated template holes 50 will be between 1 nanometer and 50 nanometers. The length of the holes will equal the thickness of substrate 62. This may be on the order of one micron for a nanotube which only has a few carbon nanotube transistors along its length, to tens of microns as the 3-D nature is scaled up. For example, several carbon nanotube electronic devices are formed along the length of a nanotube by dynamically controlling the diameter of the template by controlling the current flux applied through an electrode placed on one side of the substrate. Furthermore, it will be possible to generate carbon nanotubes with different conducting properties by precisely controlling the current flux so as to produce template segments with different diameters along the vertical axis, as illustrated in FIG. 5.

Figure 5:
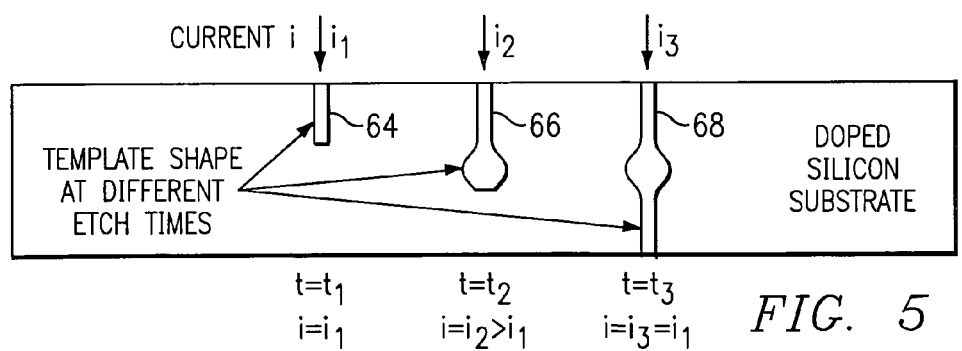
FIG. 5 shows the results of electrochemical etching as function of different current fluxes.

FIG. 5 illustrates the process of forming a discontinuity in the template along its length with snap-shots at different times. It can be seen that at different times a different etch current is applied to form the template discontinuity. During the first time interval the current has been kept constant and that produced the uniform template segment 64. At second time interval the current was increased as to produce a template segment 66. At third time interval the current was reduce to its original level and kept there. This produced the third segment 68.

FIGS. 6 and 7 show examples of template discontinuities possible with electrochemical etching. Preferred discontinuities comprise variations in the diameters of the templates along their lengths, producing serial segments with different diameters. An alternative way to produce discontinuities is to divide or branch the templates along their lengths, producing parallel segments with different diameters. The basic designs of CNMEDs that are possible with variable templates include diodes, transistors, and other two, three, and multi-terminal electronic devices. For any template that can be fabricated, a corresponding carbon nanotube can also be fabricated. A number of other designs can be fabricated that take advantage of the complex types of templates that are described here.

Figure 9:
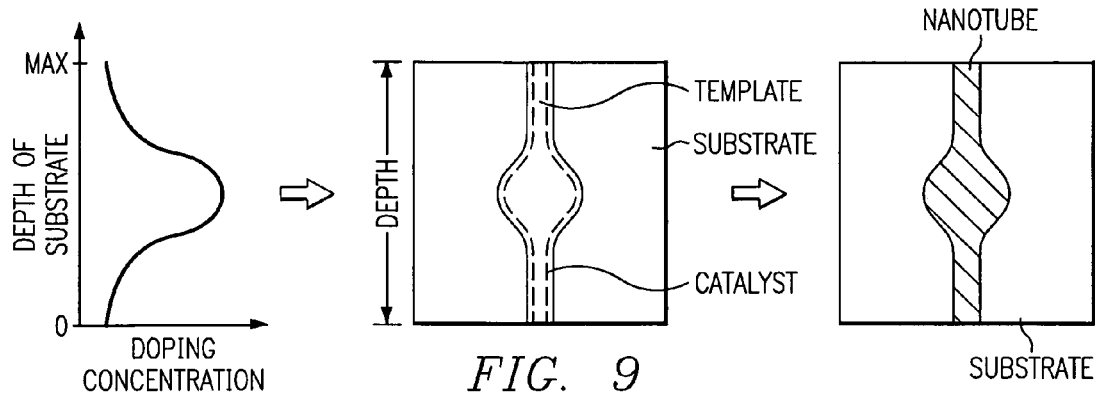
FIG. 9 shows control of the discontinuity of the template with the help of continuous doping concentration profile of the substrate along its depth.
Figure 10:
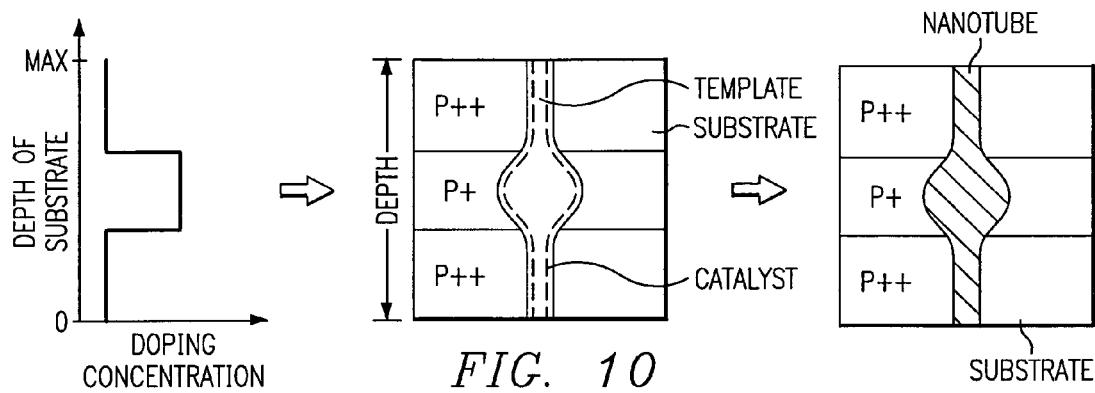
FIG. 10 shows control of the discontinuity of the template with the help of discrete doping concentration profile of the substrate along its depth.
Figure 11:
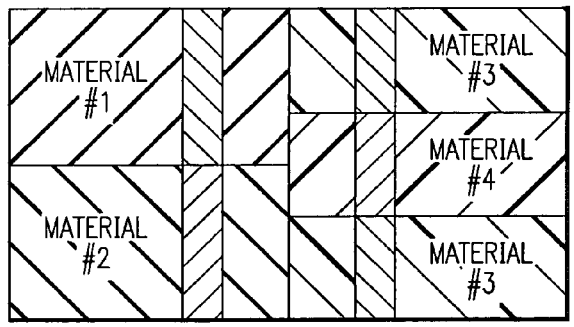
FIG. 11 shows control of the discontinuity of the template with the help of discrete bricks of different doping concentration.

FIGS. 9, 10, and 11 show a method to control the discontinuity of the template by manipulating the doping concentration of the substrate and its distribution. This approach represents an effort to balance the fabrication process as to make the critical process rely on established semiconductor processes. This may lead to making the process more manufacturable and reproducible. Standard established semiconductor processes can deliver precise doses of doping over specified depths. Thin film deposition of silicon is another standard semiconductor process. When doping concentrations are controlled, the electrochemical process only needs to provide a constant current flux and the doping difference will produce the desired template shapes.

FIG. 8 illustrates a method for establishing a direct lateral connection between adjacent carbon nanotubes. Such fundamentally new interconnect approaches would obviate the need for conventional lithographed metallic interconnects which limit the lateral spacing of the carbon nanotube devices. With the help of direct carbon nanotube interconnects, the technology could provide device densities to $10^{14}$ per cm$^2$. Furthermore, the ohmic contact between carbon nanotube and metal, which may be a limiting factor in the performance of the carbon nanotube devices, is replaced by nanotube-nanotube contact that is more intrinsic. Contactless interconnection by electron tunneling or spin coupling shifts the entire paradigm of the molecular electronic device.

FIG. 12 shows individual control in the fabrication of each template or group of templates with the help of individual electrodes for each template or group of templates. This approach allows different currents to be provided to different electrodes and thereby allows micromanagement of the electrochemical process.

FIG. 13 shows individual control of fabricating each template or group of templates with the help of masking. With this method pattern of a mask is applied to the substrate, covering an area of the substrate and exposing the rest of the substrate. An electrochemical etching can be applied to produce a template or a group of templates with desired discontinuities, over the exposed area. This approach allows that templates with different types of discontinuities be produces at different locations on the substrate.

The present invention builds on the fabrication technology disclosed in U.S. patent application Serial No. 6,146,227 entitled "Method for Manufacturing Carbon Nanotubes as Functional Elements of MEMS Devices" which is incorporated herein by reference. The referenced patent discloses method of fabricating a nanosize catalyst retaining structure (NCRS) with precise dimensions and location that can serve as a template for a carbon nanotube with controllable orientation, diameter, location, length and shape. The carbon nanotube is synthesized by thermal deposition of hydrocarbides directly from within the template coated with catalyst. The present disclosure describes in detail the methods of changing the shape of the template and with that the shape of the synthesized carbon nanotube. The change of the carbon nanotube shape introduces controlled discontinuities in the structure of the carbon nanotube. The discontinuities in the structure of the carbon nanotube promote electronic functions that enable the design of carbon nanotube based molecular electronic devices. The present disclosure also describes designs of molecular electronic devices that can be fabricated with the template method. The present disclosure also describes methods of interconnecting the carbon nanotubes.

The present fabrication process solves the problem of introducing manufacturable controllable discontinuities along the length of a carbon nanotube. It makes sense to talk only about discontinuities along the length of the nanotube since the nanotubes are essentially one-dimensional structures with their lengths many times the sizes of their diameters. The present process claims the use of a template to shape the carbon nanotube along its length. Existing methods rely on junctions between nanotubes and on kinks in their structure to produce nanotube electronic devices.

The present fabrication process solves the problem of fabricating the nanotube devices in an integrated process instead of fabricating them separately and then assembling them. The present process involves a fabrication method that produces the carbon nanotubes in-place, embedded within the substrate. This is achieved by using templates which are embedded in the substrate and consequently producing carbon nanotubes that are also embedded in the substrate. The integrated process can also produce the interconnects among the individual carbon nanotube devices. Existing methods rely on fabricating the nanotubes separately and then placing them one-by-one on electrodes to produce nanotube electronic devices. Alternatively, they may rely on random dispersion of the nanotubes over the electrodes.

The present fabrication process solves the problem of scalable manufacturing process for production of functional carbon nanotube electronic devices. The innovative process claims fabrication method that produces an array of functional carbon nanotube electronic devices in a single process. This is achieved by fabricating an array of templates that are precisely patterned on the substrate. In turn, the array of templates is used to produce an array of carbon nanotube devices. Existing methods rely on individually fabricated carbon nanotube devices that need to be interconnected to form a functional device. Some existing methods can also produce an array of uniformly distributed carbon nanotubes but cannot fabricate individual precisely-located nanotube or a pattern of nanotubes that are also functional.

The present fabrication process solves the problem of interconnects among the individual carbon nanotube devices and an interconnect to an external world. The present process involves fabrication of horizontal and vertical interconnects as part of the integrated fabrication process. Horizontal interconnecting is achieved by patterning metal interconnect lines in a plane sandwiched between substrate layers, combined with fabricating vertical nanotubes that pass through the metal interconnects. Alternative horizontal interconnects are achieved with the help of horizontal carbon nanotubes. Alternative horizontal interconnects are achieved by expanding the carbon nanotubes' diameters until two adjacent nanotubes touch. Vertical interconnects are achieved with the help of vertical conductive carbon nanotubes and by stacking one carbon nanotube device on top of another. Existing methods of interconnecting carbon nanotube devices rely on external contacts or on interconnects that are fabricated separately from the nanotubes. There are no existing vertical interconnect technologies.

The innovative carbon nanotube electronic device design solves the problem of existence of carbon nanotube logic devices that are molded within a substrate and not free-formed, that can be connected to other carbon nanotubes laterally or vertically, and that can form a complex 3-D architecture. This is achieved with the above mentioned innovative fabrication process. Existing carbon nanotube electronic device designs are free-formed, cannot be easily connected to other nanotubes, and are two terminal electronic devices (diodes).

The present disclosure illustrates: 1) a method of fabricating basic carbon nanotube molecular electronic devices (CNMEDs), 2) a method of fabricating complex devices in a 3-D architecture of CNMEDs, 3) basic designs of (CNMEDs) possible with the present fabrication methods, and 4) complex devices in a 3-D architecture of CNMEDs possible with the present fabrication methods.

Fabrication Process

The method of fabricating the basic CNMEDs and the complex devices in a 3-D architecture of CNMEDs is a unique combination of controlled electrochemical etching and catalytic carbon nanotube growth technologies. This fabrication takes advantage of the benefits offered by the established electrochemical etching technology with the emerging technology of carbon nanotube synthesis. The innovative fabrication process produces a 3-D pattern of carbon nanotubes synthesized by thermal deposition of hydrocarbides directly from within a 3-D template coated with catalyst.

The present fabrication process enables introducing controlled discontinuities in a template and, with that, in the structure of the carbon nanotubes. Preferably, the discontinuities will be introduced by exploiting the process of controlled electrochemical etching to vary the template diameter and shape along its length. The introduction of controlled discontinuities in the structure of the carbon nanotubes alters the bond configuration, and therefore the conductivity properties, at various points along the vertical axis of the nanotube. FIG. 1 shows an example of a carbon nanotube resulting from such process.

Innovative Basic CNMEDs and Complex Devices in a 3-D Architecture of CNMEDs

This invention defines CNMEDs as electronic devices that exhibit electronic functions such as rectification, switching, and emission. CNMEDs that are possible with the innovative fabrication method include diodes, transistors, and other two, three, and multi-terminal electronic devices (such as stacked transistors and diodes). The introduction of controlled discontinuities in the structure of the carbon nanotubes enables the functionality of the CNMED devices. Introduction of integrated interconnects that connect two or more carbon nanotubes in a device able to execute a logic operation also enables the functionality of the CNMEDs. Introduction of vertical stacking of two or more carbon nanotube devices also enables the functionality of the CNMEDs. FIG. 2 shows schematic representation of a portion of CNMED architecture, including vertical metallic nanotube interconnects and horizontal metallic film interconnects.

Fabrication Process Steps

The present carbon nanotube device fabrication process consists of the following process steps: (1) generation of template, (2) catalyst deposition, and (3) nanotube synthesis, as shown in FIG. 3. Other optional steps can be added to augment the fabrication process.

Control of the Carbon Nanotube Pattern in Horizontal Plane

The in-plane horizontal pattern of the templates or groups of templates can be used to control the pattern of the CNMEDs. For example, depending on the desired interconnections (i.e., depending on the particular logic gates desired), the entire process can be designed so that uniform templates (which will generate the vertical metallic interconnects) and non-uniform templates (which will generate CNMEDs) are grouped in small blocks of arrays. Metal interconnects are then used to connect the CNMEDs with the vertical metallic interconnects to create the more complex logic devices.

Control over template patterns is achieved by using means to initiate the etching at desired locations. One way of achieving this initiation is to pattern the substrate with a mask to generate pits at precise locations on a substrate that will initiate formation of a template. Another way of initiating the formation of the holes is to place an impurity, local defect, stress, or optical energy as method to initiate the formation of a template. The impurity, local defect, stress, or optical energy can be placed using masking techniques or by direct write/deposit methods. A self-organizing patterning that produces a pattern of impurity, local defect, stress, or optical energy may also be used to initiate the electrochemical etching.

Carbon Nanotube Interconnects

The present fabrication process includes means of interconnecting the carbon nanotube devices in horizontal and vertical planes to achieve true 3-D capable interconnection. Horizontal interconnecting can be achieved with patterned metal interconnect lines that intersect with the vertical nanotubes. Vertical interconnects can be achieved with the help of vertical conductive carbon nanotubes and by stacking one carbon nanotube device on top of another. The three dimensional architecture of CNMEDs, illustrated in FIG. 2, is interconnected with a combination of horizontally patterned metal lines (using conventional lithography) and integral vertical carbon nanotube interconnects, consisting of carbon nanotubes that conduct all the way or part of the way along their vertical axes.

Horizontal interconnection is achieved by building a layered structure of doped silicon and patterned metal interconnects with interconnect pads that are strategically positioned to make sure they will interconnect with the vertically etched templates. Only the top layer of the structure is patterned to produce the horizontal pattern of the templates. Once the formation of the template is initiated, the entire template will be etched through all the layers of doped silicon and metal film. At designed locations, the vertically grown carbon nanotubes will intersect the horizontal interconnects and, in particular, the strategically positioned metal pads. The doped silicon layers also act as spacing layers with predefined vertical spacing to allow connection between the conducting, semiconducting, and nonconducting vertical segments of the carbon nanotubes. The metal lines will be used to control the functioning of the electronic devices for input, output, and addressing of the logic devices. Complex logic devices can be constructed by strategically interconnecting two or more carbon nanotubes on the same or different vertical levels.

Vertical interconnection is achieved with the help of conductive carbon nanotubes whose entire purpose is to provide vertical interconnection. These interconnect carbon nanotubes are synthesized with the help of a cylindrical template with constant diameter. It is preferred that all templates with uniform diameter and all templates with variable diameter be synthesized on separate locations of the device away from each others so as to better control the template production. Another method of achieving vertical interconnection is to stack one carbon nanotube device on top of another from a single template.

Interconnection with the outside world may be achieved by funneling all the required internal connectors via conducting carbon nanotubes to a top level substrate where metallic bond pads are be lithographically fabricated. Bonding of gold contact pads to a carbon nanotube has already been demonstrated by Haesendonck et. al. (C. Van Haesendonck, L. Stockman, R. Vullers, Y. Bruynseraede, L. Langer, V. Bayot, E. Grivei, J. Issi, J. Heremans, C. Olk, "Nanowire bonding with the scanning tunelling microscope," Surface Science 386 (1997), 279-289). A ball grid array type of connection can then easily be achieved to connect the molecular device with the outside world.

Substrate for CNMEDs

Doped silicon is the preferred substrate material. This includes lightly and heavily doped P and N type silicon. It is preferred that the doping is introduced while the silicon crystal is grown in order to produce uniform concentration of doping along the thickness of the substrate. For thin silicon layers, the doping can be introduced by ion implantation.

Alternatively, aluminum is the next preferred substrate. The purity of the starting aluminum is important factor for electrochemical etching of templates. Other substrate choices include materials or composites that are suitable for electrochemical etching. A gallium arsenide substrate is also acceptable as substrate for electrochemical etching of templates.

To achieve the 3-D architecture described above, the substrate has to be prefabricated to include the metal interconnects. A prefabricated substrate includes a layered structure of doped silicon and patterned metal interconnects. Masking oxide or nitride layers will be used to produce the patterned metal lines. The most common interconnect materials include metals such as aluminum, copper, tungsten, titanium, nickel, chromium and various metal alloys. The silicon layer may be epitaxially grown, or it may be deposited. Any silicon, including amorphous, polysilicon, or crystalline silicon is acceptable as a substrate for electrochemical etching of templates. It is preferred that the substrate be made of crystalline silicon. Acceptable ways of producing the crystalline silicon include depositing polysilicon over the metal layer, implanting it with the right dose of dopants, and recrystallizing it over in a high temperature baking process. Alternatively, the desired substrate can be bonded together.

A prefabricated aluminum substrate would include layers of aluminum and patterned metal interconnects. The desired substrate can be fabricated by subsequent stacking of deposited metal lines and deposited aluminum that may have to be recrystallized.

Electrochemical Etching Process

The preferred embodiment of the present device fabrication process relies on electochemical and photoelectrochemical etching as a mechanism of generating the template. The methods of controlling an electrochemical etching process of N-type silicon are described in detail by Lehmann et. al. (V. Lehmann and H. Foil, "Formation Mechanism and Properties of Electrochemically Etched Trenches in n-Type Silicon," J. Electrochem. Soc., Vol. 137, No. 2, February 1990) which is incorporated herein by reference. The teachings of Lehmann also apply to P-type silicon, with minor adjustments known to those skilled in the art. Other research (G. Bomchil, A. Halimaoui, I. Sagnes, P. Badoz, I. Berbezier, P. Perret, B. Lambert, G. Vincent, L. Garchery, J. Regolini, "Porous silicon: material properties, visible photo- and electroluminecsence," Applied Surface Science 65/66, 1993, pp. 394-407; H. Ohji, S. Lahteenmaki, P. French, "Macro porous silicon formation for micromachining," Proc. SPIE-Int. Soc. Opt. Eng., 3223, 1997, pp. 189-197) describes porous silicon formation and its use with patterning for micromachining.

An example of electrochemical set-up of this invention is shown in FIG. 4. In one such example of electrochemical etching P++, P+, N−, and N−− doped silicon can be etched with a diluted HF acid (25% HF, 25% de-ionized water, 50% ethanol) and current densities of 10 mA/cm$^2$. Electrochemical etching of a layered substrate of silicon and metal film is slightly different from electrochemical etching of single layer of silicon.

After the template reaches the depth where the metal layer exists, the etchant will simply dissolve the thin metal layer and will continue with the etching of the silicon. This process can be used to monitor the current load and to determine when the etching of the silicon has reached the metal layer. This information may be used for control purposes. After the metal has been dissolved, there will still be a ring of metal on the circumference of the template.

After the template has been fabricated, one can optionally bake the sample in oxygen environment as to oxidize the walls of the template and electrically isolate the template walls from the surrounding substrate. This process will disable or reduce any current leakage from one nanotube (that will be synthesized within the template) to an adjacent one. This oxidation process will also shrink the diameter of the template as oxygen atoms bond to silicon atoms. Alternatively, the template walls can be baked in nitrogen atmosphere to create a nitride wall. Any other reduction of the surface with another gas may also be implemented to achieve similar goals.

Control of the Carbon Nanotube Discontinuities

The discontinuities of the template along the vertical axis of the template are used to control the bond configuration, and therefore the conductivity properties, at various points along the vertical axis of the nanotube.

Preferably, the discontinuities will be introduced by exploiting the process of controlled electrochemical etching to vary the template holes along their lengths. The preferred means for achieving discontinuities is to vary the diameters of the templates along their lengths, producing serial segments with different diameters. An alternative way to produce discontinuities is to divide or branch the templates along their lengths, producing parallel segments with different diameters.

Control of the electrochemical etching process is the most critical step in the preferred embodiment of the present fabrication process. Variation of the process parameters, such as the current density, the concentration of the etchant, the doping of the silicon substrate, the luminescence, the crystal orientation of the substrate, and the adjacent template spacing can be used to control the template discontinuities and to thereby generate carbon nanotubes with different conducting properties.

Dynamic control of the diameters of the templates along their depth is achieved by controlling the process parameters as a direct function of the depth of penetration of the etchant, and an indirect function of the etching rate and the etching time. In the preferred embodiment, the current flux is precisely controlled as function of time so as to produce template segments with different diameters along the vertical axis (FIG. 5). In one example, the electrochemical etching takes 10 minutes, where during the first 4 minutes, the current density is held at constant 3 mA/cm², followed by 2 minute etching at 10 mA/cm², followed by 4 minute etching at 3 mA/cm². It is assumed that the doping concentration is constant over the thickness of the substrate. The resulting template will be a cylindrical template with a bulge in the middle (FIG. 6A). If the order of the current density is switched, the resulting template will be an hour-glass shaped template (FIG. 6B). Examples of other possible discontinuities resulting from variations in the current flux as function of time are shown in FIGS. 6C-E. In FIG. 6C, the process of FIG. 6A is repeated two times. In FIG. 6D, the current density has been increased, but it has not been decreased. In FIG. 6E, the current density is increased with a constant rate to produce template with tapered walls. Any other combination of the above examples is also possible with the present process.

In another embodiment, the adjacent template spacing, which is produced by patterning the initiation location and spacing of the template, can be used as a controlling parameter in conjunction with the doping concentration of the substrate. If the template spacing is too far in relation to the doping density, the templates will divide, as illustrated in FIG. 7A, or branch, as shown in FIG. 7B. If the reverse is true, the template will join. Precisely controlling the current flux as function of time (indirectly as function of the depth of penetration) can produce a template that divides or branches in a desirable fashion along the vertical axis, effectively producing parallel template segments with different diameters. FIG. 7C illustrates more complex templates that can be produced with this process. Any other combination of the above examples is also possible with the present process.

The methods to control the discontinuity of the template and therefore the discontinuity of the carbon nanotube are also applicable to an aluminum substrate. The current density, the concentration of the etchant, and the adjacent template spacing are suitable process parameters that can be used to control the template discontinuities and thereby generate carbon nanotubes with different conducting properties. Substrate doping, luminescence, and the crystal orientation are not applicable process parameters in etching an aluminum substrate.

Many different templates can be fabricated with the electrochemical etching technology described above for use as templates to fabricate carbon nanotubes. These variations are contemplated to be within the skill of a person of ordinary skill in the art and are therefore believed to be within the scope of this disclosure and the appended claims.

Control of the Carbon Nanotube Diameter and Length

Process parameters, such as the current density, the concentration of the etchant, the doping of the silicon substrate, the luminescence, the crystal orientation of the substrate, and the adjacent template spacing all influence the diameter of the initiated template. Depending on the size of the desired electronic device, it is preferred that the diameter of generated template holes be between 1 and 50 nm. The electrochemical etching is also capable of generating templates that are up to microns in size. The length of the holes can be controlled by timing the entire process and may equal the thickness of the substrate. This may be on the order of one micron for a nanotube which has only one or few CNTs along its length, to tens of microns as the 3-D nature is scaled up (i.e., tens of CNTs along the length of a nanotube).

Catalyst Deposition in the Templates

The catalyst deposited within an etched cavity or template shape may be a metal catalyst, such as iron, nickel, copper, or other like catalysts known to those skilled in the art, After the template is formed, it is coated with a metal catalyst (Fe, Ni, Co, etc.). This can be achieved by chemical deposition (G. Che, B. Lakshimi, C. Martin, E. Fisher, "Chemical Vapor Deposition Based Synthesis of Carbon Nanotubes and Nanofibers Using a Template Method," Chem. Mater., 10, '98) or electrodeposition (A. Bard, L. Faulkner, Electrochemical Methods: Fundamentals and Applications, John Willey & Sons, 1980, p. 372). Such techniques have already been demonstrated. For the case of electo-oxidation and electro-deposition, we may utilize the same electrical contacts as those used for the electrochemical etching. The main challenge in this step is the uniform deposition or formation of catalysts within the template. It is desirable that the template be kept wet before proceeding with the catalyst deposition, as drying of the template walls creates surface tension that makes the catalyst diffusion more difficult.

For templates with more complex shape, the diffusion of the catalyst molecules within the network of templates will be slower. A DOE can be conducted to determine the timing required to diffuse the catalyst penetration. Mechanical vibration, vacuum suction, temperature, and use of surfactants may be employed to improve the diffusion process.

Alternatively, the deposition of the metal catalyst can be done concurrently with the electrochemical etching by incorporating traces of the metal catalyst in the etch solution. For example, iron salt may be added to the HF concentration mentioned above to introduce the catalytic metal into the etch solution. As the electrochemical etching proceeds, the metal catalyst will concurrently be deposited on the walls of the template. One advantage of this method of catalyst deposition is that it is not affected by the complexity of the template network since it is distributed concurrently with the etchant. This is the preferred method of catalyst deposition within the template.

Carbon Nanotube Synthesis

Due to the location of the catalyst, carbon nanotubes grow and are encased by the walls of the hole, causing carbon nanotubes to grow radially inwards. The diameter of the nanotube is also confined by the inner walls of the hole. Thermal deposition of hydrocarbides or CVD processes can be used to grow carbon nanotubes within the templates. In this process, a nanotube's thickness is controlled by timing the CVD process and terminating it as needed. A carefully designed process may lead to a synthesis of single wall carbon nanotubes. Alternatively, multi-walled carbon nanotubes may also be generated.

The challenge here is to achieve adequate quality of the generated carbon nanotubes, namely their conductivity profile and purity of the carbon nanotube bond. The generated carbon nanotubes will take the shape of the templates where they are synthesized. A template with variable diameters along its length will produce carbon nanotubes with variable diameters along their lengths. A template with divided or branched legs will produce carbon nanotubes with divided or branched legs. The appropriate change in the diameter of the carbon nanotube induces the desired change in the conductive properties of the carbon nanotube. For example, slightly constricting a metallic nanotube induces a pentagon-heptagon defect, resulting in a semiconducting segment of a nanotube (FIG. 1). The use of a template to mold and bound the shape of the carbon nanotube is unique.

After the carbon nanotube is synthesized in a layered structure of silicon and metal, the nanotube will make contact with the metal ring which is left after etching away the template through the metal film, thereby establishing metal contact. Thermal heating or electrical load may have to be applied to diffuse the metal layer with the carbon nanotube and to establish good electrical contact.

Carbon Nanotube Molecular Electronic Devices

The basic designs of CNMEDs that are possible with the innovative fabrication method include diodes, transistors, and other two, three, and multi-terminal electronic devices (such as stacked transistors and diodes). A number of other designs can be fabricated that take advantage of the complex types of templates that are described above. For any template that can be fabricated, a corresponding carbon nanotube can also be fabricated.

To create a logic device, one or two pentagon-heptagon defects, generated by slightly constricting a metallic nanotube, connected back-to-back and biased properly with external connections, will function as diode or transistor, respectively. The nanotube metallic segments with uniform diameter constitute vertical connectors, and can be connected to the carbon nanotube device by patterned metal lines (FIG. 2).

A single carbon nanotube segment with one discontinuity, producing two different conducting regions along the nanotube, will constitute a carbon nanotube diode in one embodiment. The carbon nanotube diode is embedded into a substrate and includes integrated source and drain electrodes. The carbon nanotube diode may be grown vertically aligned.

The carbon nanotube transistor of one embodiment is a single carbon nanotube segment with two discontinuities, producing three different conducting regions along the nanotube. The carbon nanotube transistor of this embodiment is embedded into a substrate and includes integrated source, drain, and gate electrodes. The transistor may also be grown vertically aligned.

Altering the conductivity at many points along the nanotube axis will also allow us to build multiple stacked transistors from each single carbon nanotube of the array, thus offering a true 3-D architecture. Therefore, a carbon nanotube transistor of another embodiment constitutes two or more carbon nanotube transistors, each with two discontinuities, stacked vertically. The stacked transistor of this invention is embedded into a substrate and includes integrated source, drain, and gate electrodes for each transistor.

A generic logic device of this invention is constructed by the interconnection of a few (typically three) devices in a given layer, or a few stacked devices on a single carbon nanotube. This generic logic device has 3-D architecture.

Advantages provided by various embodiments of the present invention may include flexibility and reproducibility of synthesizing carbon nanotubes which have dimensions and shapes determined by a vertically aligned template, wherein these carbon nanotubes exhibit rectifying behavior. By reproducing a plurality of these carbon nanotubes, it is possible to show the scalability by fabricating hundreds of carbon nanotube devices with similar, if not identical, electrical characteristics. These electrical characteristics may be verified by testing the rectifying behavior of a carbon nanotube device with the help of scanning probe tools by testing two or three points along the carbon nanotube device. The comparison of the results among multiple carbon nanotube devices fabricated within the same processes demonstrates similar, if not identical, electrical characteristics. Thus, a controllable electrochemical process that allows the fabrication of templates with desired dimensions is described. From this template with desired dimensions, carbon nanotube devices may be fabricated with variable diameters along a vertical axis. By synthesizing or fabricating the carbon nanotube molded by the template with a reliable and reproducible process, it is possible to, with a high degree of quality, synthesize crystalline carbon nanotube with reproducible electrical characteristics. These carbon nanotube devices may be interconnected to create and utilize carbon nanotube transistors and other similar devices. These interconnects may comprise carbon nanotube-to-carbon nanotube, or carbon nanotube-to-metal, or carbon nanotube-to-another-like-conducting-material. The electrical or chemical etching processes may be manipulated so as to produce templates with distributed and desired density patterns of carbon nanotube devices which, when interconnected, may comprise a full working logic device.

The electrical properties of carbon nanotubes comprise, among other things, the particularly high conductivity and rectification properties discussed above. It is desirable to fabricate carbon nanotube transistors in an organized manner and interconnect these carbon nanotube transistors with conducting interconnects. It is extremely desirable to have a process designed to fabricate carbon nanotube molecular electronic devices with both scalability and manufacturability.

Part of the uniqueness of the present approach is that carbon nanotube transistor fabrication can be scaled to a large number of devices with the same batch processes. The large scale, low cost approach of the present disclosure provides extremely fast, low power, ultra-high density logic and memory devices which operate at room temperature. There are at least two generations of device architecture that can be based on the approach of this disclosure. The first generation would use a combination of horizontally patterned metal films, fabricated using conventional lithography and integrated vertical structures consisting of carbon nanotubes. A second generation architecture would be based on etching horizontal holes to provide horizontal interconnection with the help of a horizontal conductive-only carbon nanotube instead of metallic lines.

ADDITIONAL EMBODIMENTS

In another embodiment of the present invention, horizontally etched templates may be employed to generate horizontal interconnection with the help of horizontal conductive-only carbon nanotubes instead of metallic interconnects. This task can be accomplished with the help of side electrodes, either on the surface or buried in the layer of silicon and metal film. For example, two electrodes located on a same level that are energized locally may produce a horizontal template. One needs to ensure that etchant can access the silicon that needs to be dissolved. Horizontal carbon nanotube interconnects may also be used as part of the carbon nanotube electronic device and not only as interconnects.

Alternatively, it is possible to establish direct lateral connections between the nanotubes by sufficiently expanding a conducting nanotube's diameter as to allow them to touch or tunnel electrons, as shown in FIG. 8. The electron tunneling connection may also be the basis for a quantum interacting between the nanotubes beyond the interconnect function it provides. Such fundamentally new interconnect approaches would obviate the need for conventional lithographed metallic interconnects or horizontal carbon nanotube interconnects and provide contact-less interconnection. This approach would also enable greatly increased device density.

In another embodiment of the present invention, the desired discontinuity of the template may be achieved by altering the doping concentration profile of the substrate along its depth. The doping profile may be continuous or discontinuous. For example, continuous profile may be produced with the help of ion implantation or thermal diffusion that may achieve the desired dopant profile. FIG. 9 illustrates a dopant profile that was achieved with double sided dopant implantation. A discontinuous profile may be achieved by producing a layered structure of substrates with different doping concentrations as shown in FIG. 10. Application of continuous current density to both samples during an electrochemical etching will produce template with variable diameter along its length. Those templates will in turn produce variable shaped carbon nanotubes as illustrated in FIGS. 9 and 10.

In another embodiment of the present invention, a brick-like structure of substrate, where each brick has desired doping concentration, may be used to fabricate multiple templates, each with its own template profile. The discontinuity produced by each brick depends on the level of its doping. FIG. 11 illustrates the design of this brick-like structure. Application of continuous current density to such sample during an electrochemical etching will produce a template with a profile that depends on which brick it passes through. The brick-like structure may be constructed with the help of multi-layer patterning, masking, and dopant implantation.

Figures 12A, 12B, 12C:
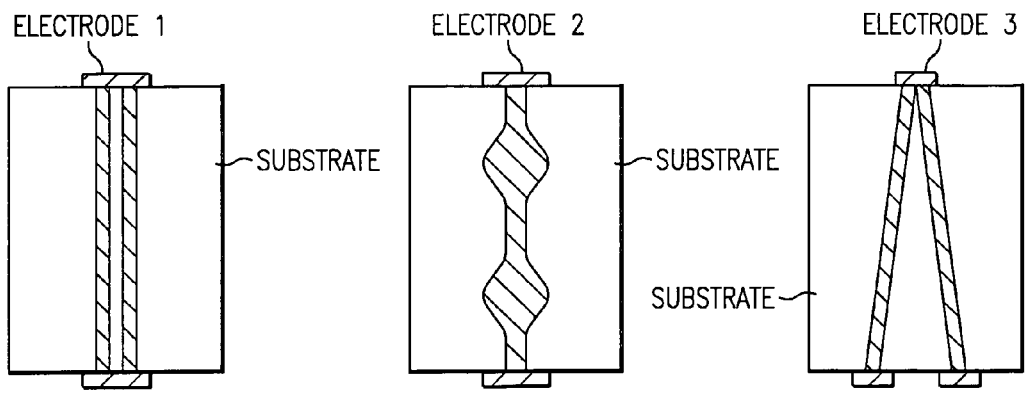
FIG. 12 shows individual control of fabricating each template or group of templates with the help of individual electrode for each template or group or group of templates.

One alternative to using a platinum mash electrode is to pattern platinum electrodes on the substrate and provide the required current flux on a localized area of the substrate. Platinum is resistant to the HF but other material may be used as electrode especially if it is buried in a layer of silicon. This invention allows that we provide different current to different electrodes and therefore micro-manage the electrochemical process. In this embodiment, individual control of fabricating each template or group of templates may be achieved by producing an individual electrode for each template or group of templates. The electrode will carry the desired current recipe for that template or group of templates. For example, in one area of the sample, we may etch with constant current (FIG. 12A,) and in the adjacent area, we may vary the current to produce variable template (FIG. 12B). In another example, we may use two electrodes that are laterally off from each other and are vertically separated by a silicon substrate to produce sloped templates with respect to the horizontal substrate, as illustrated in FIG. 12C. Alternatively, optical illumination with a pattern matching the pattern of the templates may be used in lieu of the individual electrodes to control the shape of each template or group of templates. The optical pattern may be generated by a lithographic tool.

Figure 13A:
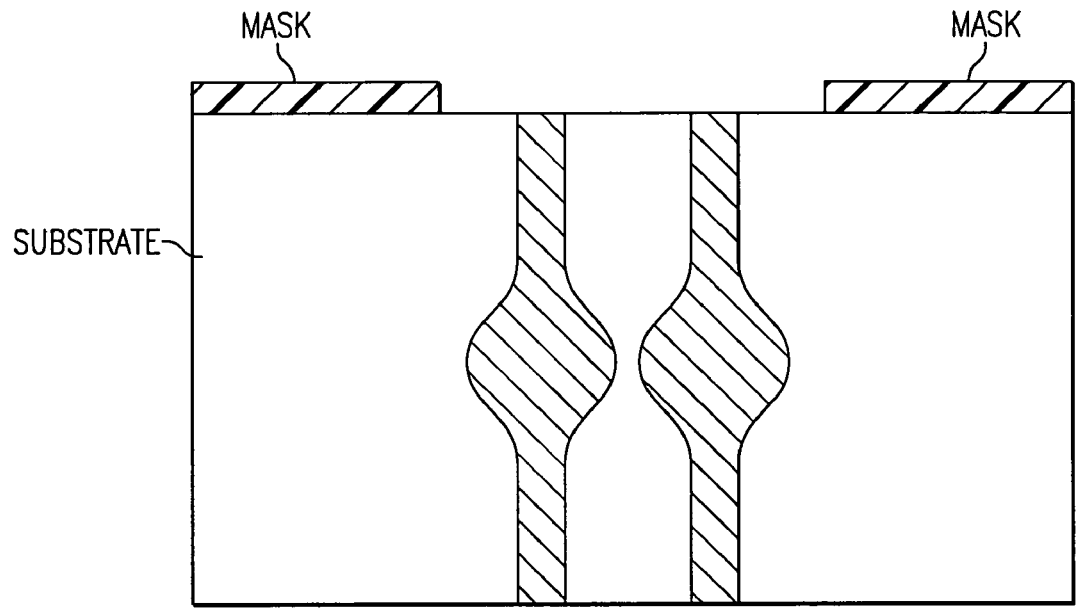
FIG. 13 shows individual control of fabricating each template or group of templates with the help of masking.
Figure 13B:
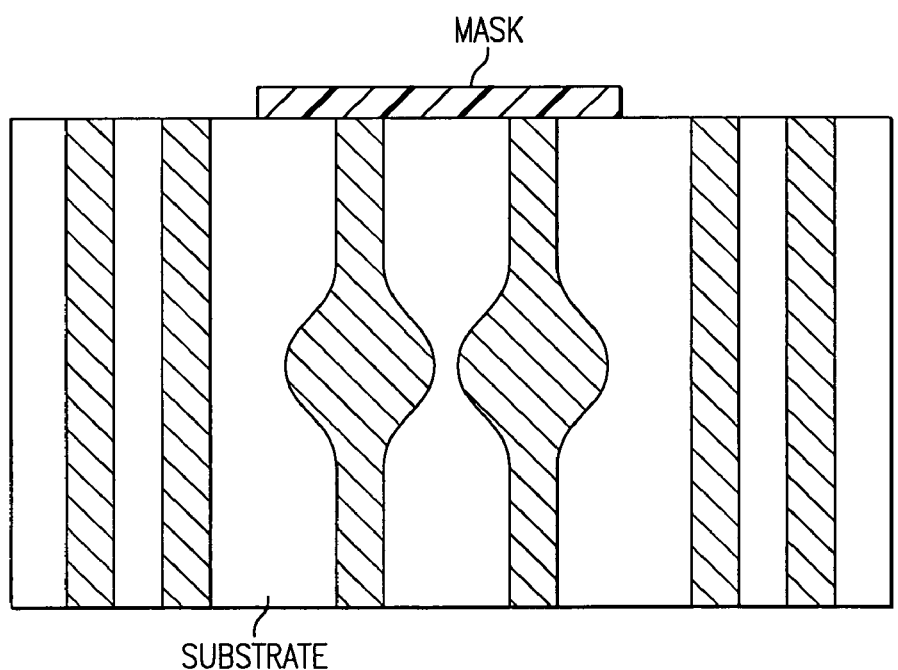

In another embodiment of the present invention individual control of fabricating each template or group of templates can be achieved with the help of masking (FIG. 13). Masking is therefore used to micro-manage the electrochemical process. With this method selected areas of the substrate will be masked while other will be exposed. Using this method an individual template or group of templates with desired discontinuities can be fabricated from the exposed areas while the masked areas will remain unprocessed (FIG. 13A). In subsequent process steps the pattern of the mask can be changed so that other areas of the substrate can now be processed. Therefore, another individual template or group of templates can be fabricated from the exposed areas with discontinuities different from the first set of fabricated templates (FIG. 13B). The advantage of this approach is that allows selective processing of the substrate, where each area is processed with its own recipe of desired discontinuities. The masking layer needs to be resistant to the etchant.

In another embodiment, the material for one or more of the horizontal interconnects may also be a catalyst material. This process allows the metal catalyst to already be present when the template uncovers the layer. In some applications, this may be the most suitable way to provide the catalyst.

Although the present invention has been described in detail, it should be understood that various changes, substitutions and alterations can be made hereto without departing from the spirit and scope of the invention as described by the appended claims.

What is claimed is:

1. A device comprising:
   a horizontally oriented substrate having:
      a silicon layer containing at least one nano-sized diameter silicon pore,
      a patterned conductive layer,
   wherein at least one carbon nanotube is fabricated within the silicon pore,
   wherein the at least one carbon nanotube is electrically coupled to the patterned conductive layer; and
   wherein substantially all of the carbon nanotubes are vertically oriented.

2. The device of claim 1, wherein the at least one vertically oriented carbon nanotube is partially embedded within the silicon pore.

3. The device of claim 1, wherein the at least one vertically oriented carbon nanotube is fully embedded within the silicon pore without protruding beyond the silicon pore.

4. The device of claim 1, wherein the at least one vertically oriented carbon nanotubes is disposed outwardly from the silicon pore.

5. The device of claim 1, wherein the silicon layer comprises a material from a class consisting of undoped silicon, doped silicon, crystalline silicon, polysilicon, silicon nitride, undoped silicon dioxide, and doped silicon dioxide.

6. The device of claim 1, wherein at least one vertically oriented carbon nanotube is electrically isolated from the silicon layer.

7. The device of claim 1, wherein the at least one vertically oriented nanotube is fabricated within a specified area of the silicon layer.

8. A device of claim 1, comprising a second patterned conductive layer within the substrate.

9. A device of claim 1, wherein the pore diameter is preferably in the range from about 1 nanometer to about 50 nanometers.

10. The device of claim 1, wherein the carbon nanotube is conductive.

11. A device of claim 1, wherein the conductive layer material comprises a member of the class consisting of aluminum, copper, tungsten, titanium, nickel, chromium, and their alloys.

* * * * *

UNITED STATES PATENT AND TRADEMARK OFFICE
CERTIFICATE OF CORRECTION

PATENT NO. : 7,335,603 B2  
APPLICATION NO. : 09/779374  
DATED : February 26, 2008  
INVENTOR(S) : Vladimir Mancevski It is certified that error appears in the above-identified patent and that said Letters Patent is hereby corrected as shown below:

Title page change item (76) Inventor: "Vladimir Mancevski, 4806 Alta Loma Dr., Dallas, Texas (US) 78749" to read as follows:
--Vladimir Mancevski, 4806 Alta Loma Dr., Austin, Texas (US) 78749--

Signed and Sealed this

Thirtieth Day of December, 2008

JON W. DUDAS  
*Director of the United States Patent and Trademark Office*